US011180865B2

(12) United States Patent
Noguchi et al.

(10) Patent No.: US 11,180,865 B2
(45) Date of Patent: Nov. 23, 2021

(54) FOUNDATION SUBSTRATE FOR PRODUCING DIAMOND FILM AND METHOD FOR PRODUCING DIAMOND SUBSTRATE USING SAME

(71) Applicants: SHIN-ETSU CHEMICAL CO., LTD., Tokyo (JP); NATIONAL INSTITUTE OF ADVANCED INDUSTRIAL SCIENCE AND TECHNOLOGY, Tokyo (JP); NATIONAL UNIVERSITY CORPORATION KANAZAWA UNIVERSITY, Kanazawa (JP)

(72) Inventors: Hitoshi Noguchi, Takasaki (JP); Toshiharu Makino, Tsukuba (JP); Masahiko Ogura, Tsukuba (JP); Hiromitsu Kato, Tsukuba (JP); Hiroyuki Kawashima, Ikeda (JP); Satoshi Yamasaki, Tsukuba (JP); Norio Tokuda, Kanazawa (JP)

(73) Assignees: SHIN-ETSU CHEMICAL CO., LTD., Tokyo (JP); NATIONAL INSTITUTE OF ADVANCED, Tokyo (JP); INDUSTRIAL SCIENCE AND TECHNOLOGY, Kanazawa (JP); NATIONAL UNIVERSITY CORPORATION, Kanazawa (JP); KANAZAWA UNIVERSITY, Kanazawa (JP)

( * ) Notice: Subject to any disclaimer, the term of this patent is extended or adjusted under 35 U.S.C. 154(b) by 230 days.

(21) Appl. No.: 15/887,207

(22) Filed: Feb. 2, 2018

(65) Prior Publication Data
US 2018/0223447 A1    Aug. 9, 2018

(30) Foreign Application Priority Data

Feb. 6, 2017   (JP) ................................ JP2017-19159

(51) Int. Cl.
*C30B 25/20*   (2006.01)
*C30B 29/04*   (2006.01)
(Continued)

(52) U.S. Cl.
CPC .......... *C30B 25/20* (2013.01); *C23C 16/0281* (2013.01); *C23C 16/272* (2013.01);
(Continued)

(58) Field of Classification Search
CPC .......... C30B 29/04; C30B 25/00; C30B 25/18; H01L 29/1602
See application file for complete search history.

(56) References Cited

U.S. PATENT DOCUMENTS 3,612,960 A * 10/1971 Takeishi .................. H01L 29/00
148/DIG. 115
5,814,149 A *  9/1998 Shintani .............. C23C 16/0263
117/104
(Continued)

FOREIGN PATENT DOCUMENTS

DE    10 2010 023 952 A1    12/2011
GB        2 295 401 A         5/1996
(Continued)

OTHER PUBLICATIONS

Umezawa et al. "Device scaling of pseudo-vertical diamond power Schottky barrier diodes." Diamonds & Related Materials, May 2009, vol. 18, pp. 1196-1199.
(Continued)

*Primary Examiner* — Matthew J Song
(74) *Attorney, Agent, or Firm* — Oliff PLC

(57) ABSTRACT

It is an object to provide a method for producing a diamond substrate effective for reducing various defects including dislocation defects and a foundation substrate used for the same. This object is achieved by a foundation substrate for
(Continued)

forming a diamond film by a chemical vapor deposition method, wherein an off angle is provided to the surface of the foundation substrate with respect to a predetermined crystal plane orientation.

7 Claims, 4 Drawing Sheets

(51) Int. Cl.

| | | |
|---|---|---|
| *H01L 21/00* | (2006.01) | |
| *C30B 25/18* | (2006.01) | |
| *C23C 16/02* | (2006.01) | |
| *C30B 25/10* | (2006.01) | |
| *C23C 16/27* | (2006.01) | |
| *H01L 21/02* | (2006.01) | |

(52) U.S. Cl.
CPC ............ *C30B 25/105* (2013.01); *C30B 25/18* (2013.01); *C30B 25/183* (2013.01); *C30B 25/186* (2013.01); *C30B 29/04* (2013.01); *H01L 21/00* (2013.01); *H01L 21/0242* (2013.01); *H01L 21/0243* (2013.01); *H01L 21/0262* (2013.01); *H01L 21/02433* (2013.01); *H01L 21/02444* (2013.01); *H01L 21/02491* (2013.01); *H01L 21/02499* (2013.01); *H01L 21/02502* (2013.01); *H01L 21/02516* (2013.01); *H01L 21/02527* (2013.01); *H01L 21/02634* (2013.01)

(56) References Cited

U.S. PATENT DOCUMENTS

| | | | | |
|---|---|---|---|---|
| 7,524,372 | B2* | 4/2009 | Meguro | .................. C30B 25/02 117/105 |
| 8,193,020 | B2* | 6/2012 | Keller | ..................... C30B 25/02 257/E21.101 |
| 2006/0234419 | A1* | 10/2006 | Linares | ............... B81C 1/00634 438/105 |
| 2007/0084398 | A1 | 4/2007 | Schreck et al. | |
| 2009/0169814 | A1* | 7/2009 | Ueda | ........................ C30B 25/02 428/141 |
| 2009/0308305 | A1* | 12/2009 | Mokuno | .................. C30B 25/00 117/108 |
| 2010/0166636 | A1* | 7/2010 | Yamada | .................. C30B 25/00 423/446 |
| 2012/0302045 | A1* | 11/2012 | Yamada | ............... C23C 14/0605 438/478 |
| 2013/0143022 | A1* | 6/2013 | Schreck | .............. C23C 16/0281 428/220 |
| 2014/0319538 | A1* | 10/2014 | Takenaka | ............ H01L 29/1602 257/77 |
| 2015/0075420 | A1* | 3/2015 | Noguchi | ................ C30B 25/105 117/86 |
| 2015/0176155 | A1* | 6/2015 | Ueda | ........................ C30B 29/04 428/408 |
| 2017/0330746 | A1* | 11/2017 | Koeck | ................. H01L 29/6603 |

FOREIGN PATENT DOCUMENTS

| | | |
|---|---|---|
| JP | H08-151296 A | 6/1996 |
| JP | 2006-303131 A | 11/2006 |
| JP | 2010-251599 A | 11/2010 |
| JP | 5454867 B2 | 3/2014 |
| WO | 2004/100238 A1 | 11/2004 |

OTHER PUBLICATIONS

OHmagari. New Diamond, Jul. 2015, vol. 31, 11-15.
May 29, 2018 Search Report issued in European Patent Application No. 18155185.4.
Oct. 21, 2020 Office Action issued in European Patent Application No. 18155185.4.
May 6, 2021 Office Action issued in Japanese Patent Application No. 2017-019159.
Oct. 14, 2020 Office Action issued in Japanese Patent Application No. 2017-019159.

* cited by examiner

Fig. 4A  <OFF ANGLE 0°>
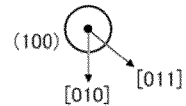
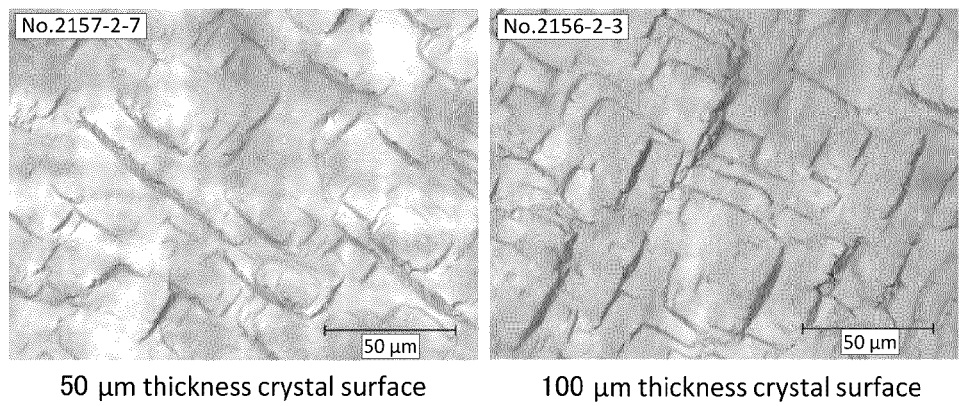
50 μm thickness crystal surface        100 μm thickness crystal surface
Fig. 4B  <OFF ANGLE 4°>
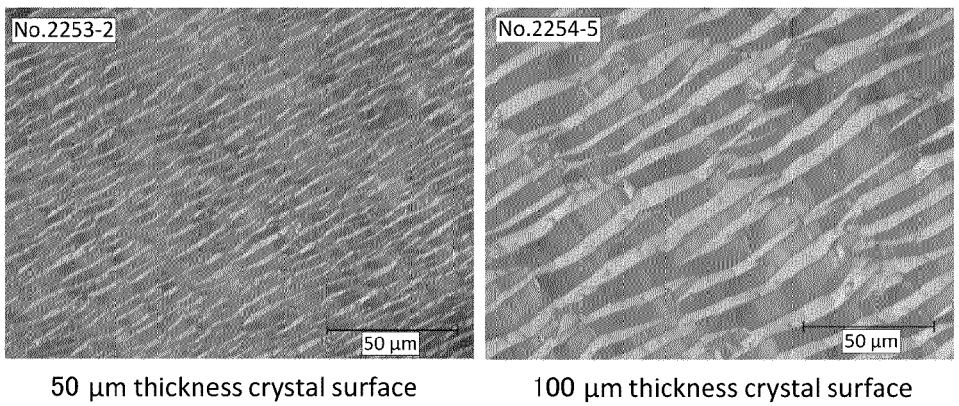
50 μm thickness crystal surface        100 μm thickness crystal surface
Fig. 4C  <OFF ANGLE 8°>
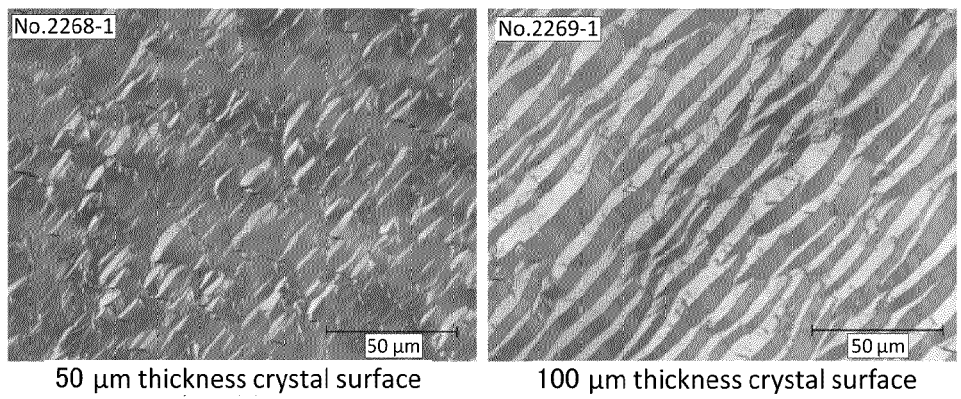
50 μm thickness crystal surface        100 μm thickness crystal surface Fig. 6A  Off Angle of 0°, Diamond Film with Thickness 100 μm
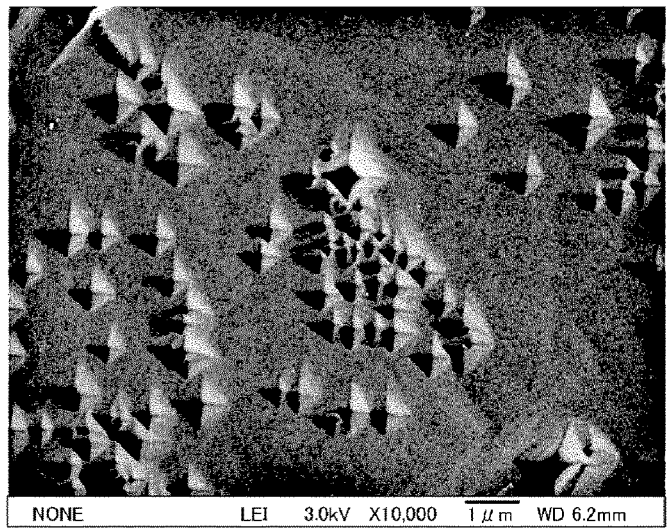
Fig. 6B  Off Angle of 4°, Diamond Film with Thickness 100 μm
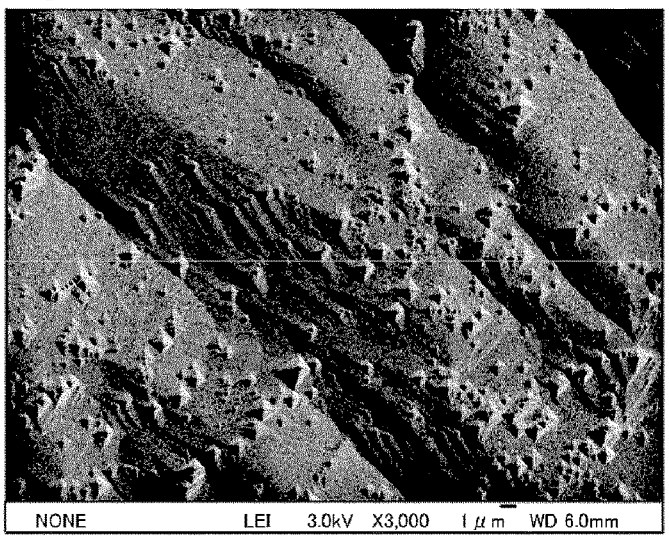
Fig. 6C  Off Angle of 8°, Diamond Film with Thickness 100 μm
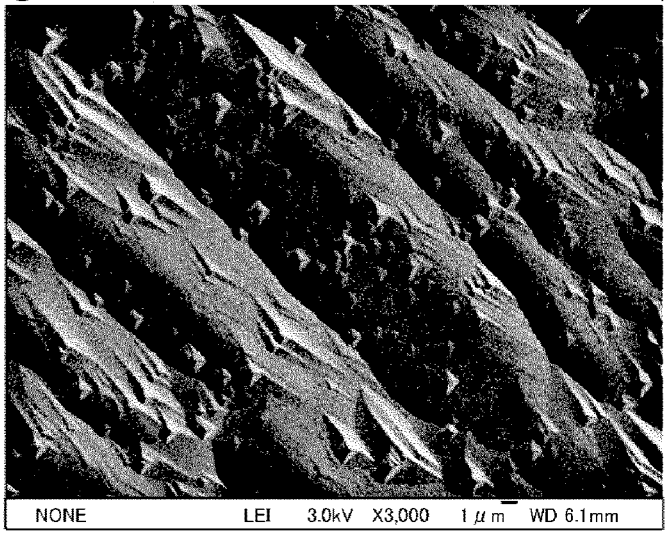

FOUNDATION SUBSTRATE FOR PRODUCING DIAMOND FILM AND METHOD FOR PRODUCING DIAMOND SUBSTRATE USING SAME

TECHNICAL FIELD

The present invention relates to a method for producing a diamond substrate, and particularly relates to a foundation substrate used for the same.

BACKGROUND ART

Diamond has a wide band gap of 5.47 eV at room temperature and is known as a wide band gap semiconductor.

Among the semiconductors, diamond has a very high dielectric breakdown electric field strength of 10 MV/cm and is capable of high voltage operation.

In addition, it has the highest thermal conductivity among known substances, so that it is also excellent in heat dissipation properties.

Further, the carrier mobility and the saturated drift velocity are extremely high, so that it is suitable as a high speed device.

Therefore, diamond shows the highest value of the Johnson performance index which shows the performance as a high-frequency and high-power device as compared with semiconductors such as silicon carbide and gallium nitride, and is said to be the ultimate semiconductor.

Diamond is thus expected to be put to practical use as a semiconductor material, and a diamond substrate having a large area and high quality is desired to be supplied.

However, diamond substrates of sufficient quality have not yet been obtained.

At present, there is an Ib type diamond synthesized by the high-pressure high-temperature synthesis (HPHT) method as a material which has been used as a diamond substrate.

However, this Ib type diamond contains a large amount of nitrogen impurities and can be obtained with a size of only 8 mm at the maximum so that its practicability is not so high.

In Non-Patent Document 1, a Schottky diode is manufactured by using diamond synthesized by the HPHT method as a substrate.

However, it has been reported that there are many dislocation defects in this diamond substrate, and even when attempting to operate by actually forming an electrode, there are killer defects in the vicinity of the electrode and in the current path so that the electrode causes malfunction.

In Non-Patent Document 2, it has been reported that abnormal growth nuclei can be suppressed by adding an off angle of 3° or more when diamond is homoepitaxially grown on an HPHT substrate, but it is unknown whether it is effective for reducing dislocation defects or not.

CITATION LIST

Patent Literature

Non-Patent Document 1: H. Umezawa et al., Diamond Relat. Mater., 18, 1196 (2009)
Non-Patent Document 2: S. Ohmagari, NEW DIAMOND 118 (2015) 11.

SUMMARY OF THE INVENTION

Technical Problem

An object of the present invention is to provide a method for producing a diamond substrate effective for reducing various defects including dislocation defects and a foundation substrate used for the same.

Solution to Problem

The foundation substrate for producing a diamond film according to the present invention is a foundation substrate for forming a diamond film by a chemical vapor deposition method, wherein an off angle is provided at a surface of the foundation substrate with respect to a predetermined crystal plane orientation.

Here, the surface of the foundation substrate may have an off angle toward the crystal axis direction <110> with respect to the crystal plane orientation {100}.

Further, the surface of the foundation substrate may have an off angle toward the crystal axis direction <-1-1 2> with respect to the crystal plane orientation {111}.

In the present invention, the off angle is preferably in the range of 2 to 15°.

For example, when the off angle is provided toward the crystal axis direction <110> with respect to the crystal plane orientation {100}, it has the off angle of 2 to 15° in its crystal axis direction <110>.

In this case, the deviation in the off direction (deviation around the orthogonal axis to the crystal plane) is preferably within ±15°.

The foundation substrate to be used in the present invention is for forming a diamond film (diamond substrate) by a chemical vapor deposition method; and the surface of the foundation substrate may be either of diamond, iridium, rhodium, palladium or platinum as long as the off angle is provided to the surface of the foundation.

Here, diamond synthesized by the HPHT method is also included in the diamond of the foundation substrate.

When the surface of the foundation substrate is diamond and the off angle is provided thereto, homoepitaxial growth occurs, and when the surface of the foundation substrate is other than diamond, heteroepitaxial growth occurs.

As a dissimilar material constituting the foundation surface, a material which is cubic crystal similarly to diamond, has small lattice mismatch with diamond, and does not react with carbon to form carbide is preferable.

Materials satisfying these conditions may be mainly mentioned a platinum group metal such as rhodium (Rh), palladium (Pb), iridium (Ir) and platinum (Pt).

Here, the lattice constant of diamond is 3.57 Å, and the lattice mismatch with Rh (lattice constant: 3.72 Å) is 4.2%, the lattice mismatch with Ir (lattice constant: 3.84 Å) is 7.6%, and the lattice mismatch with Pt (lattice constant: 3.92 Å) is 9.8%.

The lattice mismatch between diamond and the different material constituting the foundation surface is preferably 10% or less.

Ir is preferable from the viewpoints of having the highest melting point among these and stability of plasma during diamond growth and under high temperature environment.

In the present invention, the foundation substrate may have a multilayer structure in which a surface film forming the surface is laminated.

For example, in the multilayer structure, a surface film may be formed on a MgO substrate.

Further, for example, in the multilayer structure, an intermediate film consisting of a single layer or multiple layers may be formed on a silicon substrate, and the surface film may be formed on the intermediate film.

In this case, in the process of producing a film having a multilayer structure, an off angle may be formed in the surface film by providing an off angle to any of the layers.

There may be mentioned, for example, a foundation substrate in which an intermediate layer made of a material selected from single crystal magnesium oxide (MgO), single crystal strontium titanate ($SrTiO_3$), $\alpha$-($Al_2O_3$) and yttria stabilized zirconia (YSZ) is formed on a silicon (Si) substrate, and a surface layer made of a material selected from iridium (Ir), rhodium (Rh) and platinum (Pt) is further formed on the intermediate layer.

In addition, one or more layers of a layer(s) consisting of a material selected from gold (Au), platinum (Pt), titanium (Ti), chromium (Cr), iridium (Ir), rhodium (Rh), silicon (Si) and silicon oxide ($SiO_2$) may be interposed between the silicon (Si) substrate and the intermediate layer.

In the case where the diamond film is heteroepitaxially grown on the surface of the foundation substrate, nuclei of the diamond may be formed on the surface film by a bias treatment, if necessary.

Examples of the chemical vapor deposition method according to the present invention may be mentioned microwave plasma CVD, direct current plasma CVD, hot filament CVD and arc discharge plasma jet CVD.

Advantageous Effects of Invention

When the foundation substrate according to the present invention is used, it is possible to obtain a low-stress and high-quality diamond film by the chemical vapor deposition with less hillocks, abnormally grown particles and dislocation defects.

Also, a high quality diamond self-standing substrate can be obtained by removing the foundation substrate after the diamond film is formed.

When the diamond substrate according to the present invention is used for an electronic and magnetic device, a high-performance device can be obtained.

BRIEF DESCRIPTION OF DRAWINGS

FIG. 4A to 4C show photographs of the surfaces of diamond;
FIG. 6A to 6C show SEM images of etch pits.

DESCRIPTION OF EMBODIMENTS

Figure 1:
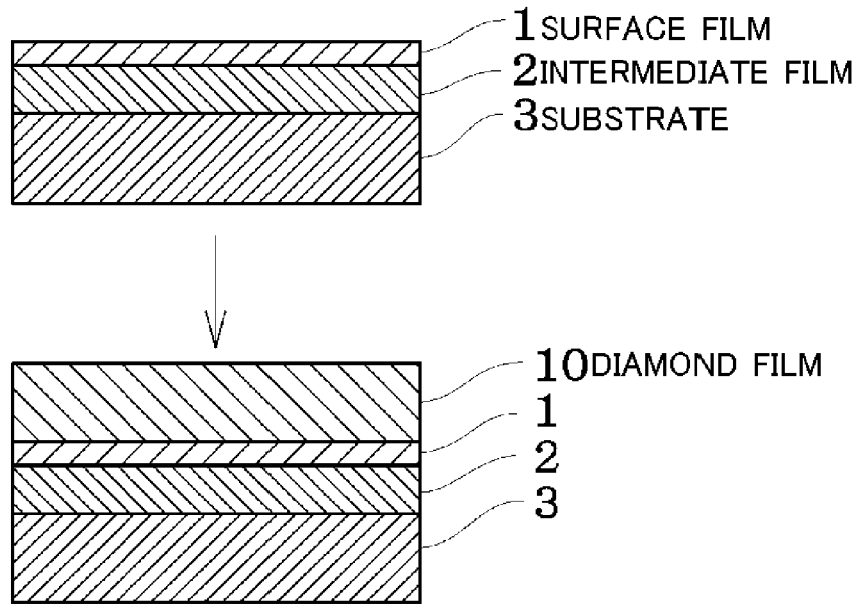
FIG. 1 shows a structural example (1) of a foundation substrate.

A cross section of the foundation substrate is shown in FIG. 1. As shown in FIG. 1, double-side-polished single crystal silicon (Si) substrates 3 having a diameter of 10.0 mm, a thickness of 1.0 mm and a surface of a (100) plane with an off angle of 0°, 4° and 8° toward the crystal axis of [011] direction were prepared.

An intermediate film 2 consisting of single crystal MgO was formed on one side of each of the prepared single crystal silicon substrates 3 by electron beam evaporation.

At this time, the conditions were made under vacuum at a substrate temperature of 900° C., and the single crystal MgO (intermediate film) was epitaxially grown until it reaches to 1 µm.

Further, a surface film 1 consisting of Ir was formed on each of the intermediate films consisting of the single crystal MgO.

For the formation of the Ir surface film 1, a high frequency (RF) magnetron sputtering method (13.56 MHz) targeting Ir having a diameter of 6 inches (150 mm), a thickness of 5.0 mm and a purity of 99.9% or more was used.

Each of the substrates on which the single crystal MgO layer has been formed was heated to 800° C., and after the base pressure was confirmed to be $6 \times 10^{-7}$ Torr (about $8.0 \times 10^{-5}$ Pa) or less, an Ar gas was introduced with 10 sccm.

After making the pressure $5 \times 10^{-2}$ Torr (about 6.7 Pa) by adjusting the aperture of the valve communicating to the exhaust system, an RF power of 1,000 W was input to carry out film formation for 15 minutes.

The resulting Ir layer had a thickness of 0.7 µm.

Each of the layered products in which the single crystal MgO layer and the Ir layer had been laminated onto the single crystal silicon substrate thus obtained was heteroepitaxially grown in accordance with the off angle provided to the single crystal silicon substrate. Therefore, each of the layered products including the silicon substrate with an off angle has a surface of which is a (100) plane with an off angle of 4° and 8° toward a crystal axis of [011] direction.

It should be noted that the off angle may be formed at any stage such as the initial silicon substrate and the intermediate film formed thereon.

Figure 3:
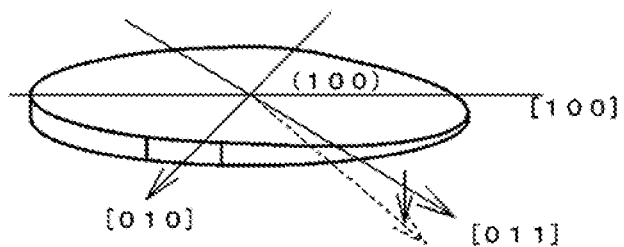
FIG. 3 shows an explanatory drawing of the off angle.

For example, after finishing the surface of the foundation substrate without an off angle, a material in which the off angle of 4° or 8° is finally provided in the crystal axis of [011] direction may be formed by polishing as schematically shown in FIG. 3.

Next, a pretreatment (bias treatment) was performed for nucleation of diamond.

The foundation substrate was set on a flat plate type electrode with a diameter of 15 mm with the Ir layer side up.

After the base pressure was confirmed to be $1 \times 10^{-6}$ Torr (about $1.3 \times 10^{-4}$ Pa) or less, hydrogen-diluted methane ($CH_4/(CH_4+H_2)$=5.0 vol. %) was introduced with 500 sccm.

After the pressure was made 100 Torr (about $1.3 \times 10^4$ Pa) by adjusting the aperture of the valve communicating to the exhaust system, a negative voltage was applied to the electrode at the substrate side to expose it to plasma for 90 seconds whereby the foundation surface was subjected to the bias treatment.

Diamond 10 was heteroepitaxially grown on the respective foundation substrates of off-angles of 0°, 4° and 8° produced by the above by the DC plasma CVD method.

The foundation substrate subjected to the bias treatment was set in a chamber of a DC plasma CVD apparatus, and after evacuating it to a base pressure of $10^{-3}$ Torr (about $1.3 \times 10^{-1}$ Pa) or less by a rotary pump, hydrogen-diluted methane ($CH_4/(CH_4+H_2)$=5.0 vol. %) which is a raw material gas was introduced with 1,000 sccm.

After making the pressure of the chamber 110 Torr (about $1.5 \times 10^4$ Pa) by adjusting the aperture of the valve communicating to the exhaust system, and then, a direct current of 2.0 A was passed therethrough to carry out film formation.

When the temperature of the foundation substrate during the film formation was measured by a pyrometer, it was 950° C.

When the resulting diamond film was subjected to X-ray diffraction measurement (incident X-ray wavelength: 1.54 Å), the half value width of the rocking curve of the diffraction intensity peak at $2\theta$=119.5° belonging to the diamond (004) was 720 arcsec (about 0.2°).

An observation photograph of the resulting diamond film by the optical microscope is shown in FIG. 4.

FIG. 4A in which the off angle of 0° shows many hillocks being generated, while those in which the off angle of 4° and the off angle of 8° show step bunching forms in which the steps are flown in one direction and no hillocks or abnormal growth particles were observed as shown in FIGS. 4B and 4C.

Next, the etch pit density was evaluated.

The surfaces of the diamond film were subjected to plasma treatment by using a microwave plasma CVD apparatus (Astex Model AX6350) under conditions of 2,200 W, a hydrogen gas with 500 sccm, at 110 Torr for 1 hour.

The results of SEM observation of the surfaces treated above are shown in FIG. 6.

FIG. 6A in which the off angle is 0° showed an etch pit density (EPD) of $1 \times 10^8$ cm$^{-2}$, FIG. 6B in which the off angle is 4° showed the EPD of $5 \times 10^7$ cm$^{-2}$, and FIG. 6C in which the off angle is 8° showed the EPD of $3 \times 10^7$ cm$^{-2}$.

Figure 5:
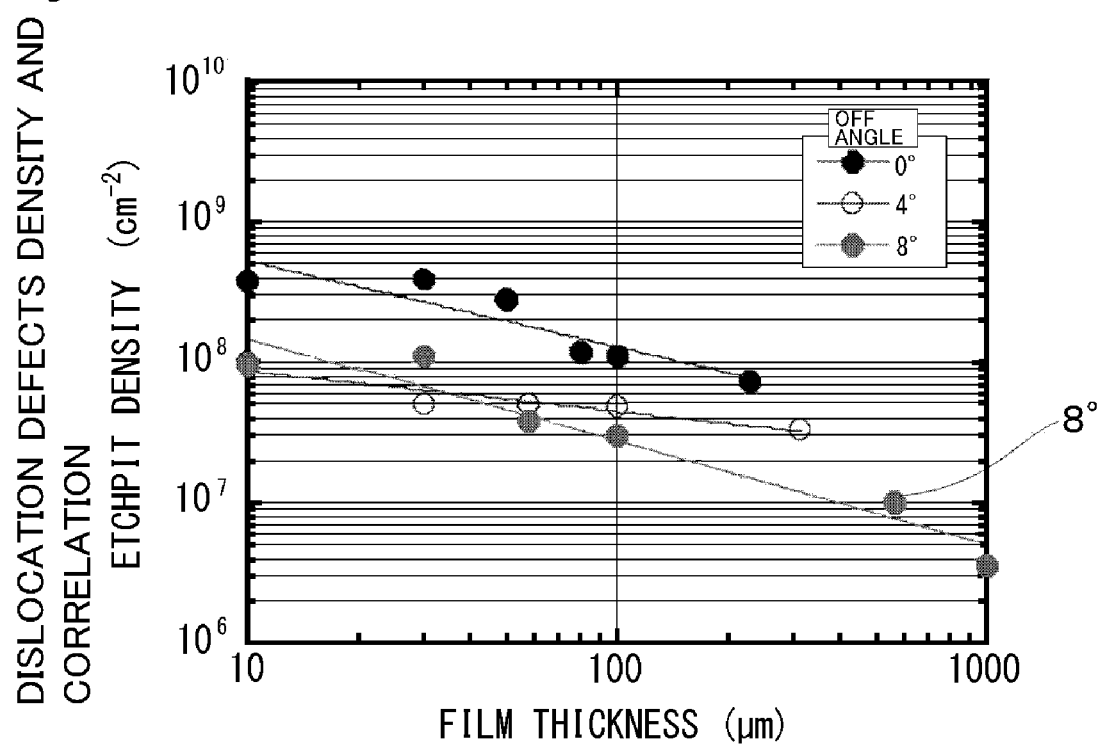
FIG. 5 shows evaluation results of etch pits.

A graph of the results in which the relation between the film thickness of the diamond film and the EPD is investigated is shown in FIG. 5.

It could be clarified that generation of hillocks and abnormally grown particles could be suppressed and dislocation defects (EPD) could be reduced by forming an off angle on the surface of the foundation substrate.

In particular, whereas at the off angle of 0°, hillocks and abnormally grown particles occurred more frequently so that it could not be made a thick film, at the off angle of 8°, EPD could be reduced by about two orders of magnitude with a thick film of a film thickness of about 1 mm.

Figure 2:
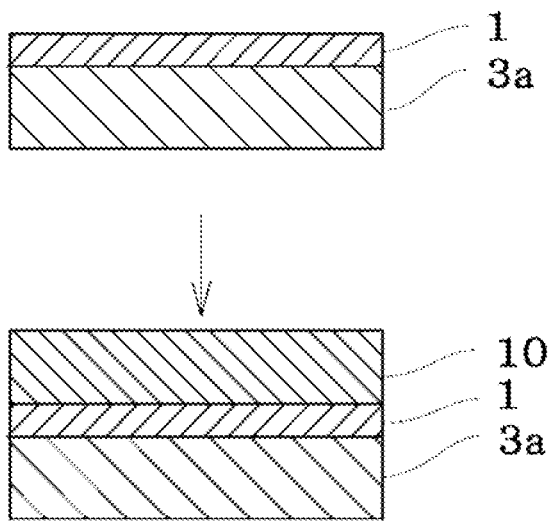
FIG. 2 shows a structural example (2) of a foundation substrate.

As shown in FIG. 2, an off angle is provided to the surface of the substrate 3a consisting of a single crystal MgO, YSZ, SrTiO$_3$ or α-alumina (Al$_2$O$_3$), and a surface film 1 consisting of Rh, Pd, Ir or Pt may be formed as a surface film.

When a surface film consisting of an Ir layer is formed on a MgO substrate to which an off angle is provided in the same manner as in the above-described example and a diamond film is formed thereon, it can be confirmed that dislocation defects are reduced by providing the off angle.

What is claimed is:

1. A foundation substrate for forming a diamond film by a chemical vapor deposition method,
wherein an off angle is provided to a surface of the foundation substrate toward a crystal axis of [−1−1 2] direction or its three-fold symmetric direction with respect to a crystal plane orientation of (111);
wherein the off angle is in the range of 2 to 15°; and
wherein a deviation of the direction of the off angle is within ±15°.

2. The foundation substrate for forming a diamond film according to claim 1, wherein the surface of the foundation substrate is any one of diamond, iridium, rhodium, palladium and platinum.

3. The foundation substrate for forming a diamond film according to claim 1, wherein the foundation substrate has a multilayer structure in which a surface film forming the surface is laminated.

4. The foundation substrate for forming a diamond film according to claim 3, wherein the multilayer structure comprises a MgO substrate and a surface film formed thereon.

5. The foundation substrate for forming a diamond film according to claim 3, wherein the multilayer structure comprises a silicon substrate, an intermediate film comprising a single layer or multiple layers formed thereon, and a surface film formed on the intermediate film.

6. A method for producing a diamond substrate which comprises homoepitaxially growing or heteroepitaxially growing diamond on the foundation substrate for forming a diamond film according to claim 3, wherein the off angle is formed on the surface film by providing the off angle to any of the layers in a course of forming the multilayer structure.

7. A method for producing a diamond substrate which comprises homoepitaxially growing or heteroepitaxially growing diamond on the foundation substrate for forming a diamond film according to claim 1.

* * * * *